US012248047B2

(12) United States Patent
Galve et al.

(10) Patent No.: US 12,248,047 B2
(45) Date of Patent: Mar. 11, 2025

(54) MAGNETIC RESONANCE IMAGING WITH PRIOR KNOWLEDGE AND OVERSAMPLING

(71) Applicants: CONSEJO SUPERIOR DE INVESTIGACIONES CIENTÍFICAS (CSIC), Madrid (ES); UNIVERSITAT POLITÈCNICA DE VALÈNCIA, Valencia (ES)

(72) Inventors: Fernando Galve, Valencia (ES); Joseba Alonso, Valencia (ES); José Miguel Algarín, Valencia (ES); José Maria Benlloch, Valencia (ES)

(73) Assignees: CONSEJO SUPERIOR DE INVESTIGACIONES CIENTÍFICAS (CSIC), Madrid (ES); UNIVERSITAT POLITÈCNICA DE VALÈNCIA, Valencia (ES)

( * ) Notice: Subject to any disclaimer, the term of this patent is extended or adjusted under 35 U.S.C. 154(b) by 286 days.

(21) Appl. No.: 18/010,118

(22) PCT Filed: Jun. 21, 2021

(86) PCT No.: PCT/EP2021/066762
§ 371 (c)(1),
(2) Date: Dec. 13, 2022

(87) PCT Pub. No.: WO2021/259828
PCT Pub. Date: Dec. 30, 2021

(65) Prior Publication Data
US 2023/0341493 A1    Oct. 26, 2023

(30) Foreign Application Priority Data
Jun. 22, 2020  (EP) .................................... 20382540

(51) Int. Cl.
*G01R 33/561*    (2006.01)
*G01R 33/48*    (2006.01)

(52) U.S. Cl.
CPC ......... *G01R 33/561* (2013.01); *G01R 33/482* (2013.01); *G01R 33/4824* (2013.01)

(58) Field of Classification Search
CPC . G01R 33/482; G01R 33/4824; G01R 33/561
See application file for complete search history.

(56) References Cited

U.S. PATENT DOCUMENTS 8,849,002 B2 * 9/2014 Chinn .................... A61B 6/037
                                                                370/464
8,941,381 B2 * 1/2015 Feinberg ............ G01R 33/5615
                                                                324/309

(Continued)

FOREIGN PATENT DOCUMENTS

EP       2233940 B1    8/2013

OTHER PUBLICATIONS

M.A. Bernstein, "Handbook of MRI Pulse Sequences", Book, 2004, 1-939, Elsevier.

(Continued)

*Primary Examiner* — Gregory H Curran
(74) *Attorney, Agent, or Firm* — Hayes Soloway PC

(57) ABSTRACT

The invention provides a method for performing magnetic resonance imaging, MRI, which exploits prior knowledge of the interactions between electromagnetic fields and spins in the sampled object. This technique is able to provide shorter acquisition times with respect to traditional (Nyquist-Shannon limited) MRI. The method is based on an encoding matrix formalism constructed from the specific knowledge of how every spin would evolve in time depending on their position for a given pulse sequence. This particular previous knowledge has not been fully exploited previously by tra- (Continued)

ditional MRI techniques. Moreover, the method of the invention can be used in combination with other schemes, such as compressed sensing, parallel imaging, or deep learning, for further shortening the MRI scan time.

15 Claims, 2 Drawing Sheets

(56) References Cited

U.S. PATENT DOCUMENTS

| | | | |
|---|---|---|---|
| 10,739,432 B2 * | 8/2020 | Huang | G01R 33/5601 |
| 2014/0212012 A1 | 7/2014 | Fain et al. | |

OTHER PUBLICATIONS

Alexander Selvikvag Lundervold, "An overview of deep learning in medical imaging focusing on MRI", Article, 2018, 102-127, vol. 29, Z Med Phys.

Emil Y. Sidky, "Accurate image reconstruction from few-views and limited-angle data in divergent-beam CT", Article, 2018, 1-30, University of Chicago.

Fernando Galve, "Model-driven reconstruction for highly-oversampled MRI", Article, 2020, 1-7, Cornell University Library.

E. Mark Haacke, "Constrained reconstruction: A superresolution, optimal signaltonoise alternative to the Fourier transform in magnetic resonance imaging", Journal, 1989, 1-11, vol. 16, No. 388, Medical Physics.

Mark A. Griswold, "Partially Parallel Imaging With Localized Sensitivities (PILS)", Journal, 2000, 602-609, vol. 44, Magnetic Resonance in Medicine.

Klaas P. Pruessmann, "Sense: Sensitivity Encoding for Fast MRI", Journal, 1999, 952-962, vol. 42, Magnetic Resonance in Medicine.

Anagha Deshmane, "Parallel MR Imaging", Journal, 2012, 55-72, No. 36, Journal of Magnetic Resonance Imaging.

Jeffrey Tsao, "Ultrafast Imaging: Principles, Pitfalls, Solutions, and Applications", Journal, 2010, 252-266, vol. 32, Journal of Magnetic Resonance Imaging.

Dong Liang, "Deep Magnetic Resonance Image Reconstruction: Inverse Problems Meet Neural Networks", Article, 2020, 141-151, vol. 37, No. 1, IEEE Signal Process Mag.

Markus Weiger, "Exploring the Bandwidth Limits of ZTE Imaging: Spatial Response, Out-of-Band Signals, and Noise Propagation", Journal, 2015, 1236-1247, vol. 74, Magnetic Resonance in Medicine.

Florian Wiesinger, "Ideal Spiral CSI for Dynamic Metabolic MR Imaging of Hyperpolarized [1-13C]Pyruvate", Journal, 2012, 8-16, vol. 68, Magnetic Resonance in Medicine.

Richard Gordon, "Algebraic Reconstruction Techniques (ART) for Three-dimensional Electron Microscopy and X-ray Photography", Journal, 1970, 471-481, vol. 29, Journal of Theoretical Biology.

* cited by examiner

MAGNETIC RESONANCE IMAGING WITH PRIOR KNOWLEDGE AND OVERSAMPLING

CROSS-REFERENCE TO RELATED APPLICATIONS AND PRIORITY

This patent application claims priority from PCT Application No. PCT/EP2021/066762 filed Jun. 21, 2021, which claims priority from European Patent Application No. 20382540.1 filed Jun. 22, 2020. Each of these patent applications are herein incorporated by reference in their entirety.

FIELD OF THE INVENTION

The present invention relates in general to the field of nuclear Magnetic Resonance Imaging (MRI), and in particular to an imaging acceleration method exploiting explicit prior knowledge of the interactions between the electromagnetic fields and the sample spins in MRI systems.

BACKGROUND OF THE INVENTION

Spatial frequency space, or k-space, is a cornerstone of MRI due to two different reasons. Firstly, Fourier Transforms (FT) provide a simple mapping between k-space and the sought image space and, secondly, the mathematical description of the magnetic resonance (MR) signal induced in the detectors exactly matches that of an FT. Also, in traditional MRI, where the magnetic gradient fields employed for encoding the spatial information are linear throughout the Field of View (FoV), the k-space position is related to the acquisition time (t) by $k=\int_0^t \gamma \cdot G(t')dt'$, where $\gamma$ is the gyromagnetic ratio ($2\pi \cdot 42$ MHz/T for protons), G is a magnetic field gradient strength, and k is given in units of rad/m. This simplifies to $k=\gamma \cdot G \cdot t$ when the gradient pulses are boxcars of amplitude G.

The applied gradients determine which k-space regions are sampled. In conventional imaging sequences, including spin echo and gradient echo, and in fast imaging sequences, a line, or multiple lines of k-space in the frequency direction are acquired consecutively. Many k-space sampling techniques have been disclosed in the MRI field. For instance, two-dimensional (2D) data can be gathered on a Cartesian rectangular grid or following a spiral trajectory in 2D k-space.

MRI acquisitions are necessarily of finite duration, and signals are digitized in a process before the image reconstruction. Finite readouts lead to blurring and edge artifacts (e.g. Gibbs ringing), which become more prominent the shorter the acquisition. On the other hand, the digitization of the MR signal means that a discrete Fourier transform (DFT) can be applied on the data for image reconstruction, which is highly efficient and undemanding in terms of computational resources.

With DFT-based reconstruction techniques: i) the number of points acquired in k-space exactly equals the number of pixels in the image space; ii) the sampling rate determines the size of the FoV, which is the distance over which the magnetic resonance image is acquired; iii) image resolution is determined by the readout duration; and iv) the Nyquist-Shannon (NS) theorem applies. The latter establishes that, for a bandwidth-limited continuous time signal (as in MRI), sampling at a rate faster than twice the signal bandwidth (the NS-limit) is useless, since there is no useful information to recover beyond this limit. For traditional MRI in one spatial dimension z and a linear magnetic field gradient of strength G, the emission bandwidth is $\gamma \cdot G \cdot \Delta z$ and the NS-limit is given by a sampling frequency:

$$\omega_{NS}=2\cdot\gamma \cdot G \cdot \Delta z, \quad (1)$$

where all frequencies are in units of rad/s and $\Delta z$ is the size of the FoV.

Data oversampling generally refers to acquiring data at rates faster than twice the bandwidth of the detected signal, e.g. with dwell times smaller than $\delta t_{NS}=\pi/(\gamma \cdot G \cdot \Delta z)$ in traditional MRI. This dwell time stands for the interval between digitized samples. Alternatively, oversampling can refer to sampling k-space points spaced by less than the NS-limit given a FoV and a gradient strength, i.e. $\delta k < \pi/\Delta z$.

An example of oversampling is shown in patent application EP2233940A1, which refers to a method for simultaneous excitation and acquisition in magnetic resonance. In this document, the oversampling is performed such that the time-domain signal sampling rate is higher than required by the frequency range covered by the object to be reconstructed, and whereby the oversampling (see paragraph [0022]) is an optional step and sufficiently high to:

Account for effects of transmit-receive switching, more particularly, for reducing baseline artefacts due to missing initial signal in the case of interleaved excitation and acquisition.

Provide an extrapolation of missing time-domain signal regions.

The document EP2233940A1, as is evident from its title "Simultaneous excitation and acquisition in magnetic resonance" and its paragraph [0011], refers to a very particular and challenging task: to reconstruct the image of a sample when simultaneous excitation and acquisition is applied. This approach is barely applied in the field because it leads to k-space gaps. Note that this document refers to an acquire-while-exciting scenario, thereby being based on an encoding matrix that relates to the amplitudes $P_m$, which are called "individual amplitude and phase of the m-th subpulse" (see paragraph [0041] in D01).

Furthermore, the oversampling factor allowed in EP2233940A1 is given by the radiofrequency pulse time-discretization step dp as follows from the paragraph [0041] which is reproduced below: "The interval dp is chosen short enough to enable full excitation of the nominal bandwidth with a pulse of this duration. Thus, the maximum allowed dp is used as an upper limit for choosing dt of the temporal discretisation. Furthermore, it is used as an upper limit for the oversampled dwell time $dw_{ov}$ and hence determines the minimum allowed oversampling factor set for the acquisition".

In this way, the goal of the document EP2233940A1 is to perform an extrapolation of those signal points which have not been recovered during the MRI (e.g., due to switching effects). This problem is also shared by Zero Echo Time (ZTE) sequences, which also suffer from k-space gaps due to switching that must be filled by extrapolation, as described in Weiger et al., "*Exploring the Bandwidth Limits of ZTE Imaging: Spatial Response, Out-of-Band Signals, and Noise Propagation*", Magnetic Resonance in Medicine, 2015, 74, p. 1236-1247.

Oversampling can be applied with different purposes, like avoiding aliasing and wrap around artefacts in MRI, or even obtaining additional information when MRI is combined with other imaging modalities. An example is illustrated in patent application US20140212012A1. The goal of this document is to acquire simultaneous spectral and spatial images of a subject having received a dose of a hyperpolarized molecular imaging agent. For this purpose, the k-space sampling trajectory is designed to spatially oversample, in phase direction, to elicit phase differences between oversampled points, thus requiring a much longer scan time. In this way, the redundant information obtained by oversampling is used for obtaining spectroscopic information from the phase differences between the oversampled points.

A consequence of the Nyquist-Shannon theorem is that DFT methods applied on oversampled data do not improve reconstruction quality. A possibility to overcome this limitation is to take advantage of prior knowledge regarding the sampled objects, such as patterns in the acquired signals or the physical principles employed for imaging.

One approach with regard to prior knowledge involves compressed sensing (CS) techniques, which represent an important breakthrough in the field. Indeed, in CS the number of pixels in the reconstructed images need not exactly match the number of data points acquired in k-space; and the number of data samples can be related to information content rather than signal bandwidth. If the former is sparse in some basis, then fewer samples may be acquired, reducing scan times without sacrificing image quality. It turns out such bases exist, exploiting redundancies or non-local features in the properties of real sampled objects, so CS is now a mainstay in everyday clinical scanning.

Another widely used technique utilizing prior information is parallel imaging (PI), based on reading in the magnetic resonance signal from a phased array (multiple detection coils), rather than a single detector, as described in Deshmane et al., "*Parallel MR imaging*", *Journal of Magnetic Resonance Imaging*, 2012, 36(1), p. 55-72. In PI, a previous measurement of individual coil sensitivity with regard to different sample regions provides an additional encoding that speeds up MRI acquisitions. Each detection (receiver) coil is more sensitive to the specific volume of tissue nearest to that coil, which means that the coils provide an additional source of spatial information for image reconstruction. Note that in PI a reduced amount of k-space data is acquired, which speeds up the scan but also leads to aliasing in the reconstructed image. Eventually, the undersampled data from each of the detection coils are combined into an unaliased reconstructed image with special algorithms, such as SENSE (see Pruessmann, K. P. et al., "*SENSE: sensitivity encoding for fast MRI*", *Magnetic Resonance in Medicine: An Official Journal of the International Society for Magnetic Resonance in Medicine*, 42(5), 952-962, (1999)) or PILS (see Griswold, M. A. et al., "*Partially parallel imaging with localized sensitivities (PILS)*", *Magnetic Resonance in Medicine*, 44(4), 602-609, (2000)).

An even earlier example of exploiting prior knowledge to improve the quality of the resulting images are constrained reconstruction techniques (see E. Haacke et al., "*Constrained Reconstruction: A Superresolution, Optimal Signal-to-Noise Alter-native to the Fourier Transform in Magnetic Resonance Imaging*", *Medical Physics*, 16, 388-97, (1989)). These are capable of unlimited resolution when samples can be described analytically e.g. by a series of boxcar functions.

In order to illustrate the usefulness of reconstructing with prior information, FIG. 1 shows a simple example where prior information is used to reconstruct a spectrum from a digitized time signal, yielding better results than DFTs. The continuous time signal in FIG. 1(a) consists of only two frequencies, displayed as dashed arrows in FIG. 1(b). Two acquisitions and reconstructions are compared: an NS-limited acquisition over a longer readout window, marked as the larger points in FIG. 1(a); and a shorter acquisition over-sampled by a factor of four, labelled as x4 and marked with smaller points in FIG. 1a). The spectrum results from Fourier transforming the NS-limited data (larger points). It captures the essence that there are two distinct frequencies and amplitudes, but the DFT adds significant blurring and shifts, due to the finite acquisition. Assuming a model for the original signal made out of sinusoids with well-defined phases, a simple fit can retrieve the two frequency components without error (perfect reconstruction). In this way, readouts can become extremely short if the model (prior knowledge) is accurate. This example is a significant simplification of the complex MRI signals and procedures encountered in real MRI, but it shows how prior knowledge can be exploited for improved reconstructions and shorter acquisitions compared to traditional methods.

MRI sequences can be generally divided into two groups: single-shot and multi-shot. Single-shot MRI refers to pulse sequences where the whole of k-space is sampled in a single step, without interruption. Single-shot readouts typically take tens of milliseconds. They are an important tool of so-called ultra-fast MRI, as described in J. Tsao. "*Ultrafast imaging: principles, pitfalls, solutions, and applications*". *Journal of Magnetic Resonance Imaging*, 32(2), 252-266, (2000), and especially valuable for imaging of dynamic processes. On the other hand, the vast majority of MRI scans are carried out with multi-shot sequences, where k-space is covered in multiple steps (interleaved using more than one acquisition, also known as sequence repetitions), spaced by a repetition time TR. Multi-shot sequences are longer than with a single-shot approach, but they yield higher quality reconstructions when time resolution requirements are low (see M. A. Bernstein, et al., "*Handbook of MRI pulse sequences*". *Elsevier*, 2004).

When it comes to MRI acceleration, it generally refers to shortening the overall scan time for a given sequence and target spatial resolution. One form of MRI acceleration involves reducing the amount of acquired data for reconstructing an image of a given resolution (e.g. CS). Another possibility involves acquiring multiple data samples simultaneously (e.g. PI). In addition to shortening the readout, the gain in acquisition speed can be applied to achieving other benefits, such as increasing the signal-to-noise ratio (SNR).

Single and multi-shot sequences can be accelerated with different strategies. For instance, the length of single-shot sequences is usually determined by the readout window, whereas multi-shot sequences are largely dependent on the repetition time TR, which is typically set by the relaxation times T1 of the sample tissues. Thus, single-shot sequences could be accelerated by shortening the acquisition time as in FIG. 1, while multi-shot sequences can be sped up more efficiently by removing k-space lines from the acquisition or reducing the number of required averages for a target SNR in the reconstruction.

Spatial encoding in MRI relies on inhomogeneous magnetic fields, which provide a Larmor or spin precession frequency ($\omega_L$) dependent on the position of the nuclei in the Region of Interest (ROI). Mathematically, this can be expressed as $$\omega_L(\vec{r}, t) = \gamma |\vec{B}(\vec{r}, t)| \tag{2}$$

where $\vec{B}$ is the magnetic field at position $\vec{r}$ at time t. As the imaging pulse sequence evolves, the phase acquired by the spins depends on their position:

$$\Phi(\vec{r}, t) = \int_0^t \Phi_L(\vec{r}, t') dt' = \int_0^t \gamma |\vec{B}(\vec{r}, t')| dt'. \tag{3}$$

During their precession, spins induce a time-varying signal, s(t), with the interference of all spins on a nearby detector:

$$s(t) \propto \int_{ROI} e^{-i\Phi(\vec{r},t)} \rho(\vec{r}) \, d\vec{r}, \quad (4)$$

where $\rho(\vec{r})$ is the spin density distribution describing the sample in the ROI. This signal is then digitized during a readout or acquisition window.

Typically, scanners make use of linear gradient fields, in the presence of which the Larmor frequency varies also linearly with position. In this scenario, an inverse Fourier Transformation (FT) of s(t) suffices to reconstruct $\rho(\vec{r})$, since the integral in Eq. (3) after down-mixing is trivial and Eq. (4) becomes:

$$s(t) = \int e^{-i\gamma G z t} \rho(z) dz, \quad (5)$$

where it is assumed, without loss of generality, that a gradient of strength G points along the z-axis.

An alternative to Fourier operations is to build a linear forward model for the system response to the applied pulse sequence, define a cost function for the reconstruction, optionally add regularization terms to penalize unrealistic results or promote specific features of the reconstruction, and solve a linear inversion problem. Once the time-dependent signal resulting from the interference of the precessing nuclei has been recorded and discretized, s(t) becomes a vector S of length equal to the number of time steps $n_t$, $\rho(\vec{r})$ becomes a vector $\rho$ of length equal to the number of voxels $n_v$, and $\exp\{-i\Phi(\vec{r},t)\}$ becomes the encoding matrix $\Phi$ with $n_t$ rows and $n_v$ columns. Equation (4) thus changes to $$S = \Phi\rho, \quad (6)$$

and $\rho$ can be obtained by direct inversion of the encoding matrix as $\Phi^{-1}S$, or by any other means of solving the system of linear equations, e.g. by iterative algorithms such as Algebraic Reconstruction Techniques (ART) (see R. Gordon et al., "*Algebraic Reconstruction Techniques (ART) for Three-Dimensional Electron Microscopy and X-Ray Photography*", Journal of Theoretical Biology, 29 (1970), 471-81). Specifically, every matrix element $\Phi_{ij}$ corresponds to the phase accumulated by the sample spins in the j-th pixel when only the i-th k-space data point is sampled:

$$\Phi_{ij} = e^{-i\int_0^{t_i} \gamma |\vec{B}(\vec{r}_j,t')| dt'}, \quad (7)$$

where $\vec{r}_j$ is the position of the j-th pixel and $t_i$ is the time at which the i-th data point is sampled.

Algebraic Reconstruction Techniques (ART) estimate $\rho$ based on the recursive $$\rho_n = \rho_{n-1} + \lambda \frac{S_i - \Phi_i \cdot \rho_{n-1}}{\|\Phi_i\|} \Phi_i^*, \quad (8)$$

where $\lambda$ is a control parameter, $S_i$ is the i-th component in vector S, $\Phi_i$ is the i-th row in the encoding matrix $\Phi$, and $\rho_0$ can be set to zero. The estimated solution $\rho_n$ is updated $n_t \times n_{it}$ times through Eq. (8), where $n_{it}$ stands for the overall number of ART iterations.

Although iterative methods such as ART are computationally slow compared to DFT, they can outperform Fourier reconstruction in other relevant metrics. These iterative methods update the estimated $\rho_n$ based on the data consistency penalty $S_i - \Phi_i \cdot \rho_{n-1}$, which ensures that the reconstructed image tends to the solution of $S = \Phi\rho$. The data consistency penalty can be viewed as a gradient descent minimization of the cost function $\|S - \Phi\rho\|_2$ which is an $l_2$-norm. As such, many other $l_1$-norm, $l_2$-norm or other penalties can be applied to the problem, such as total variation (TV), which is the sum of finite differences of $\rho_n$ between neighbouring pixels, Tikhonov penalty or penalties related to coefficients in specific functional basis, such as wavelet, discrete cosine, etc., of importance in the field of Compressed Sensing. For an example of TV penalty applied to ART, see Sidky EY et al., "*Accurate image reconstruction from few-views and limited-angle data in divergent-beam CT*", J X-ray Sci Tech. 2006; 14(2):119-39.

Artificial intelligence (AI) can be employed for numerous tasks in MRI. Particularly relevant to this context are image reconstruction and scan acceleration, which are non-mutually exclusive. Certain deep learning (DL) architectures such as convolutional neural networks (CNNs) or generative adversarial networks (GANs) can be useful for image reconstruction compatible with k-space undercoverage (see A. Lundervold et al., "*An Overview of Deep Learning in Medical Imaging Focusing on MRI*", Zeitschrift Fur Medizinische Physik (Elsevier GmbH, 2019), 102-27). In addition to these techniques, iterative reconstruction algorithms can be "unrolled" onto DL networks to speed up reconstruction processes (see e.g. D. Liang et al., '*Deep Magnetic Resonance Image Reconstruction: Inverse Problems Meet Neural Networks*', IEEE Signal Processing Magazine, 37 (2020), 141-51).

So far, the acceleration schemes used in MRI acquisitions comprise PI, CS and methods based on AI. They exploit prior knowledge about specific features of the imaged objects or of the acquired data in the sensor domain (usually k-space). Thanks to this prior knowledge, short scan times are achieved, leading to reduced patient discomfort and overall costs, and improving the performance of imaging modalities such as myocardial perfusion imaging, high-resolution coronary imaging, functional neuroimaging, diffusion imaging, or whole-body scanning. Nevertheless, all these applications would benefit from an additional shortening of scan times. Hence, there is a strong motivation to develop further MRI techniques based on prior knowledge of a different nature.

SUMMARY OF THE INVENTION

As it has been outlined in the previous section, reducing the scan time while keeping the reconstruction quality is one of the major challenges of MRI. Although CS and PI techniques provide shortened scan times, some MRI applications (e.g. perfusion imaging, high-resolution coronary imaging, functional neuroimaging, diffusion imaging, or whole body scanning) would benefit from a further reduction in scan time, for instance, for obtaining a more reliable image or avoid motion artifacts, among others.

As a solution of the aforementioned limitations of MRI techniques, the present invention proposes a method for MRI based on a novel use of prior knowledge, namely the interactions between the electromagnetic fields and the patient/object in MRI systems, which can advantageously be exploited to provide an acceleration in the imaging process. The invention thereby provides a method for exploiting prior information available in MRI systems which traditional sampling and reconstruction methods do not fully exploit. In the proposed method, the data is acquired at sampling rates beyond the Nyquist-Shannon limit, and images are reconstructed by solving a system of linear equations characterized by an encoding matrix constructed from the specific knowledge of how every spin would evolve in time depending on their position for a given pulse sequence. This method will be referred to as 'OS-MRI', which stands for Over-Sampled Magnetic Resonance Imaging.

In a first inventive aspect, the OS-MRI method involves the reconstruction of a sample described by its spin density distribution within a Field of View (FoV) from magnetic resonance signals acquired with at least one detector. The OS-MRI comprises preferably the following steps, in any technically possible order:

a) applying an electromagnetic pulse sequence to the sample, comprising a plurality of radio frequency and encoding gradient pulses;

b) computing the NS-limit for the dwell time, $\delta t_{NS}=\pi/bw$, wherein bw is the bandwidth of the acquired magnetic resonance signal;

c) defining a target oversampling rate, OR, along the readout direction as $\delta t_{NS}/\delta t$, wherein $\delta t$ is the dwell time;

d) performing a prior knowledge analysis step comprising the calculation of interactions between the sequence applied to the sample and its spins, as well as the time evolution of the spins depending on their position for said pulse sequence; and wherein the results of the calculation are discretized in time steps and stored as an encoding matrix, $\Phi$, whose matrix elements $\Phi_{ij}$ correspond to the phase accumulated by the sample spins in the j-th pixel when only the i-th k-space data point is sampled;

e) performing a data acquisition step, wherein the MRI signals derived from each encoding gradient pulse are detected, stored, and discretized as a vector S, at a dwell time such that the oversampling rate, OR, is higher than 1;

f) performing an image reconstruction step based on solving for $\rho$ from S and $\Phi$, where $\rho$ is the discretized spin density distribution.

Note that the prior knowledge exploited by OS-MRI is different from prior knowledge used in state-of-the-art techniques such as PI and CS. Unlike other techniques available in the prior art, OS-MRI applies oversampling along the readout direction rather than along the phase-encoding direction.

In OS-MRI, the time evolution expected for every spin in a ROI is written into an encoding matrix of arbitrary dimensions, i.e. where the number of reconstructed voxels/pixels and of time steps (k-space points) are not necessarily constrained by standard Fourier considerations or the Nyquist-Shannon theorem. As a consequence of this prior knowledge, OS-MRI can extract useful information from signals sampled at rates much higher than their emission bandwidth, i.e. oversampled with respect to the NS-limit.

For a given pulse sequence, every element $\Phi_{ij}$ (with i denoting the row and j the column) in the encoding matrix corresponds to the signal contributed by the imaged object spins in the j-th pixel when the i-th data point is sampled. Alternatively, $\Phi_{ij}$ can be interpreted as a normalized value of the i-th k-space point in an ideal acquisition where only the j-th sample pixel contributed to the detected MRI signal. All $\Phi_{ij}$ matrix elements can be individually calculated from Equations (3-4), or alternatively its discrete version as shown in Equation (6), where the spin density $\rho(\vec{r})$ is set to zero everywhere except for the pixel of interest. In this way, the encoding matrix accounts for the time evolution of the phase accumulated by the sample spins during the scan and represents the source of prior knowledge that OS-MRI exploits. It is worth pointing out that OS-MRI is fully compatible with parallel imaging (PI), which allows OS-MRI to reach even shorter scan times, as later explained. If OS-MRI is combined with PI, a particular encoding matrix is required to characterize each detector.

Specific implementations of the pulse sequence lead to different k-space coverage. The following paragraphs briefly describe some of these:

In a particular embodiment of the invention, the MRI reconstruction method comprises a pulse sequence configured to provide a k-space data sampling as points in a rectangular Cartesian grid.

In another embodiment of the invention, the method comprises a pulse sequence configured to provide a k-space data sampling along non-Cartesian trajectories, such as radial scanning, spiral scanning or echo planar imaging (EPI). Non-Cartesian trajectories are particularly useful for real-time imaging and common in clinical practice.

In yet another embodiment of the invention, the pulse sequence is configured to yield a spiral scan of k-space, according to $k(t)=(\alpha \cdot \theta(t)/FoV) \cdot e^{i\theta(t)}$ where t stands for the time, $\theta(t)$ is a time dependent function and $\alpha$ (scalar) is the so-called acceleration parameter, where $\alpha=1$ is the non-accelerated case. In a more particularly convenient implementation of the object of the invention, the spiral scan of k-space follows the curve $k(t)=(\alpha \cdot \theta(t)/FoV) \cdot e^{i\theta(t)}$, with $\alpha \geq 1$. In a preferred embodiment of the invention, the spiral is characterized by an acceleration of $\alpha=2$. In other embodiments, the acceleration evolves in time, $\alpha=\alpha(t)$, leading to a variable-density spiral.

An alternative embodiment of the invention comprises a pulse sequence configured to provide a k-space sampling in which the sampled data are evenly spaced.

Another particular embodiment of the invention comprises a pulse sequence configured to provide a k-space sampling in which the sampled data are unevenly spaced.

In further embodiments of OS-MRI, the pulse sequence comprises single-shot or multi-shot sequences.

In a more advantageous embodiment, the disclosed methods are combined with CS, which exploits prior knowledge of the sparsity of the object or the detected signal (acquired data) in a given basis. This may be used to reduce k-space coverage with respect to using exclusively either CS or OS-MRI.

In certain embodiments of the invention, the image reconstruction step is performed by one of the following methods:
  inverting $\Phi$;
  iteratively solving a system of equations $S=\Phi\rho$;
  iteratively solving a system of equations $S=\Phi\rho$ along with regularization terms such as Total Variation or Tikhonov regularization.

In this way, the image is retrieved by finding a solution to a linear system of equations defined by $S=\Phi\rho$; either using iterative algorithms, or alternatively by performing the inversion of encoding matrix to retrieve $\rho$, or by means of any other reconstruction methods known in the art. Particularly, the aforementioned iterative algorithm can be a method belonging to the family of algebraic reconstruction techniques (ART). Furthermore, the possibility exists of finding a solution to the linear system of equations including penalization terms. Another approach for reconstructing the image consists on finding a solution to the linear system of equations with deep learning or artificial intelligence techniques.

In further embodiments of the invention, the MRI signals are detected by a plurality of detectors, each of them characterized by its own encoding matrix, and then combined in order to obtain the reconstructed image of the sample.

In this way, the MRI scan can be performed even faster in comparison with standard OS-MRI using multiple detectors (e.g. with a phased array) and applying PI techniques.

In yet further embodiments of the invention, the oversampling rate (OR) is higher than 3, higher than 5, higher than 10, or higher than 100.

A further object of the invention refers to an MRI apparatus comprising:
- a magnet operable to provide a magnetic field;
- a set of gradient coils configured to generate inhomogeneous magnetic fields over the field of view;
- a radio frequency transmitter configured to transmit a radio frequency field, composed of a plurality of pulse sequences, to a sample placed into the magnetic field;
- a radio frequency receiver arranged to detect a magnetic resonance signal;
- a data acquisition unit to record the magnetic resonance signals;
- means for processing the information provided by the data acquisition unit.

The aforementioned MRI apparatus is characterized by performing the sample reconstruction by means of the OS-MRI method.

In some embodiments of the previous MRI apparatus, both the radio frequency transmitter and receiver are combined in the same physical element. In other preferred embodiments, the MRI apparatus comprises a plurality of radio frequency receivers, i.e. multiple detection coils.

In this way, by taking into account the acquired by multiple coils along with parallel imaging (PI) techniques can significantly reduce the scan time of OS-MRI, as the improvement linked to PI is independent to the boost provided by prior knowledge in OS-MRI. Consequently, the combination of both PI and OS-MRI further lessens the scan time required for reconstructing the sample.

Unlike acquire-while-exciting methods (as the one disclosed in document EP2233940A1), this invention is included in the frame of more conventional excite-then-acquire sequences of MRI events, in which the acquisition takes place after excitation, thus avoiding the k-space gaps derived from simultaneous excitation and acquisition.

Advantageously, in this invention there is no restriction on the minimum oversampling factor, and the criterion to choose a higher or lower oversampling factor is not related to bandwidth or time-discretization considerations, but only to the desired improvement on the image quality or the amount of scan acceleration (as given by undersampling in the phase-encoding direction of k-space). It is worth underlining that the oversampling is an essential feature of this invention in order to obtain information beyond Nyquist limit, such that to reconstruct an image of the sample with higher quality (e.g., in terms of a better signal-to-noise ratio) or, alternatively, to enable a faster acquisition by means of phase-encoding undersampling.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The accompanying drawings comprise specifically the following figures.

DETAILED DESCRIPTION OF THE INVENTION

Figure 1:
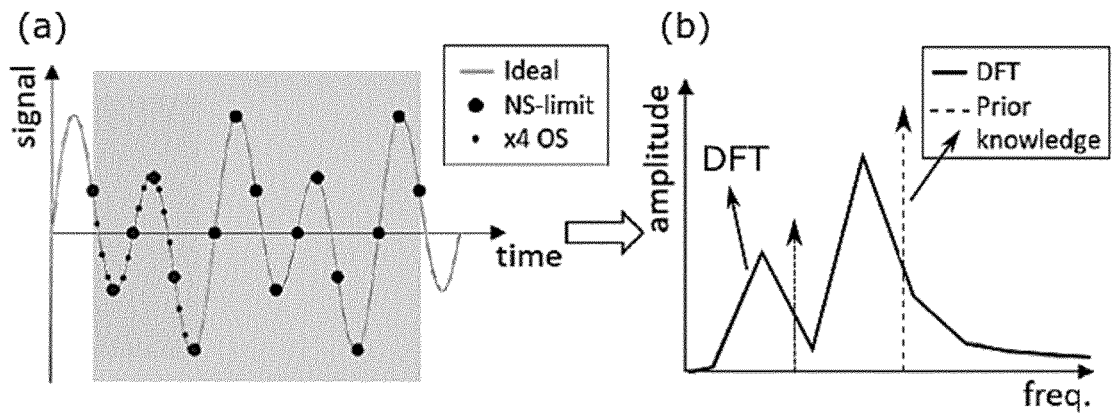
FIG. 1 is a prior-art example of a known technique for incorporating prior knowledge in MRI reconstruction processes.

Specifically, the OS-MRI method comprises the reconstruction of a sample (described through its spin density distribution) by taking advantage of the prior knowledge regarding the interaction between the electromagnetic fields (e.g. radio frequency and gradient pulse sequences) applied to a sample (object, patient body, etc.) and the spins of said sample.

With this approach, OS-MRI can be used to accelerate MRI acquisitions in three different scenarios:

1) With single-shot sequences (relevant for e.g. time-resolved imaging of dynamic processes), where the prior knowledge plus encoding matrix approach yields reconstructions of similar quality to those from a DFT performed on a fully sampled k-space, but in a fraction of the readout time.
2) With multi-shot sequences (employed in the vast majority of clinical scans), where k-space coverage can be reduced by either removing lines or fully sampling a smaller k-space than would be otherwise required (this is known as k-space undersampling in PI and CS methods).
3) The oversampling in OS-MRI makes this method highly immune to noise, which can be used to shorten the averaging time required for a predefined reconstruction quality. This aspect can be combined with either of the above scenarios. In this way, with OS-MRI, less averaging time is required in comparison with conventional DFT-based MRI.

In OS-MRI, the time evolution expected for every spin in a ROI is written into an encoding matrix of arbitrary dimensions, i.e. where the number of reconstructed voxels/pixels and of time steps (k-space points) are not necessarily constrained by standard Fourier considerations or the Nyquist-Shannon theorem. As a consequence of this prior knowledge, OS-MRI can extract useful information from signals sampled at rates much higher than their emission bandwidth, i.e. oversampled with respect to the NS-limit.

In the following paragraphs it will be shown how OS-MRI is suitable for the acceleration of single-shot sequences, thus providing reliable MRI reconstructions with shorter scan times. FIG. 2(a) shows a 2D knee phantom and FIGS. 2(b)-(d) show simulated reconstructions thereof, obtained with different single-shot sequences. The images from FIGS. 2(b)-(c) are both acquired in 100 ms (the former with an NS-limited sampling at ≈83 kHz, the latter with OS-MRI at 10 MHz), but the level of detail is significantly sharper when we exploit prior information. In this way, prior knowledge leads to reconstructions in which the fine details of the image (boundaries, etc.) are reconstructed more accurately.

The point-spread function (PSF) is the response of the MRI system if the sample were a single and infinitesimal point scatterer. The PSFs for acquisitions of FIGS. 2(b)-(d) are also displayed for comparison. Note that the PSF of FIG. 2(b) for EPI FFT sequence exhibits a strong Gibbs ringing artifact, thus reducing the quality of the reconstructed image. The rectangular Cartesian grid in the bottom left plot marks the k-space points sampled for the NS-limited acquisition and reconstruction (b). In the same plot, and overlaid to a rectangular Cartesian grid, a spiral scan of k-space is shown. The spiral follows an OS-MRI acquisition sampled 120 times faster and reaching a similar quality in only 20 ms (FIG. 2(d)). With the spiral k-space sweep, Gibbs ringing is suppressed in comparison to the EPI FFT case. The oversampling protocol allows to reconstruct spirals with the form $k(t)=(\alpha \cdot \theta(t)/FoV) \cdot e^{i\theta(t)}$ where t is the time, $\theta(t)$ is a time dependent function and $\alpha=1$ in standard protocols that can be reconstructed by FT methods, while $\alpha \neq 1$ (in the plot $\alpha=2$) is an accelerated spiral where radial motion is faster than angular motion in k-space, and is not amenable to FT methods. For $\alpha=1$, one can reach higher values in k-space with the same acquisition time, and thus higher spatial resolution. Importantly, the shown acceleration by a factor of five (x5) in acquisition time is disconnected from (thus multiplicative to) existing PI, CS and AI boosts.

In another preferred embodiment of the invention, a single-shot sequence is accelerated by sampling the data at rates faster than the NS-limit during a shortened, continuous readout, where the extra data points and prior knowledge compensate for the reduction in the acquisition. In a more advantageous embodiment, a single-shot spiral sequence is accelerated by sampling the angular function at rates faster than the NS-limit and using $\alpha=2$, where the extra data points and prior knowledge compensate for the reduction in the acquisition.

Figure 2:
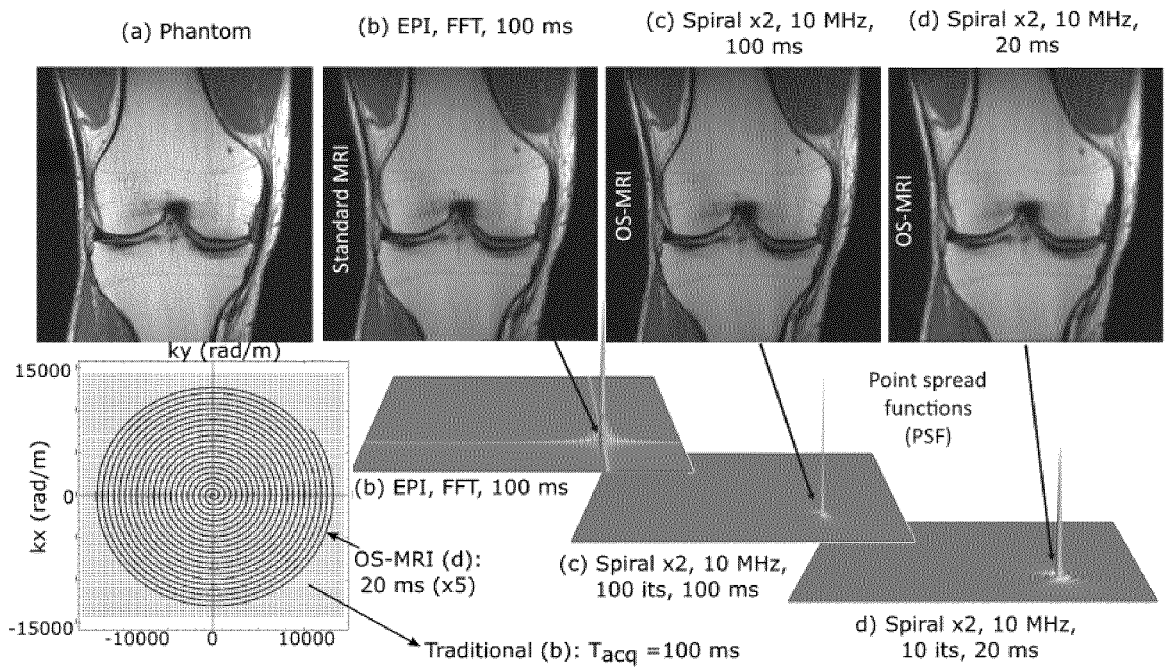
FIG. 2 shows reconstructions of a human knee with standard MRI methods and OS-MRI.
Figure 3:
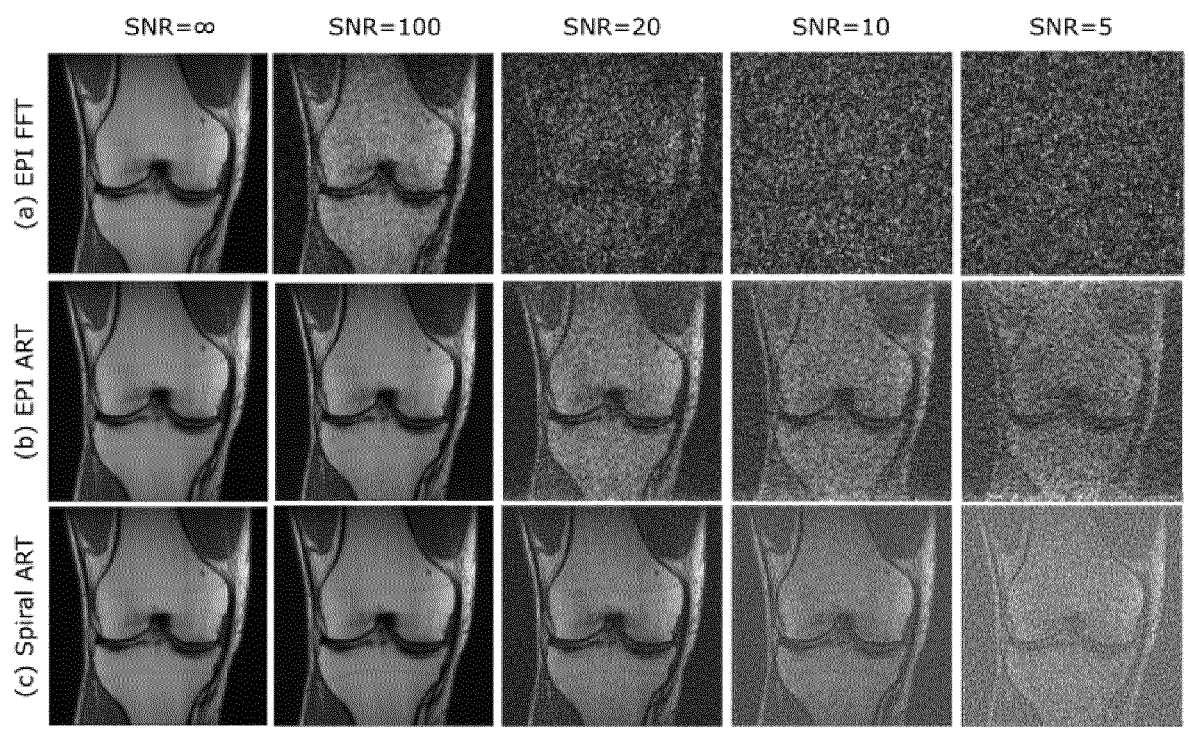
FIG. 3 shows reconstructions (120×120 pixels, acquired in 100 ms) of a human knee with standard MRI methods and OS-MRI for different signal-to-noise ratios. Both ART reconstructions, echo planar and Spiral, exhibit a dwell time of $\delta t=100$ ns.

FIG. 3 illustrates the resilience to noise of the above encoding and reconstruction methods. Again, the same knee phantom from FIG. 2 is used for testing different MRI schemes. In particular, FIG. 3 shows several simulated ART and fast Fourier transform (FFT) reconstructions of the knee for Cartesian EPI and non-Cartesian spiral acquisitions under different SNR conditions. In this case, the SNR has been measured as the ratio between the MRI signal (at initial time, t=0) and the standard deviation of the noise. FIG. 3(a) corresponds to NS-limited acquisitions at ≤83 kHz (dwell time of 12 μs), while FIGS. 3(b)-(c) are OS-MRI acquisitions with dwell times of 100 ns. The reconstruction quality is significantly higher when oversampling is exploited (OS-MRI), despite the increased acquisition bandwidth and, consequently, the stronger noise contribution to the detected signal.

OS-MRI exploits explicit prior knowledge of the highly controlled interactions between the electromagnetic fields and the patient/object in MRI systems. So far, this knowledge has not been fully exploited by MRI methods. Acknowledging it allows to extract useful information from signals sampled at rates well beyond the NS-limit. This novel approach is distinct from state-of-the-art acceleration methods such as PI, CS or Deep Learning, which capitalize on specific features of the imaged objects or of the acquired data. The acceleration provided by OS-MRI is therefore disconnected from (multiplicative to) boosts provided by other existing techniques. For this reason, the combination of OS-MRI with those techniques is very beneficial in terms of scan time shortening. Although CS involves k-space undersampling, the prior knowledge used in OS-MRI partially countervails that. For instance, a multi-shot sequence can be accelerated with OS-MRI by a reduction in the k-space coverage required for a reconstruction, where the oversampling along the readout direction and prior knowledge compensate for the reduction in the acquired k-space.

In a preferred embodiment of the invention, the data acquisition is performed with multiple detection coils, which further speed up the OS-MRI scan. In this case, every detection coil is characterized by its own encoding matrix and the reconstruction of the sample comprises PI techniques. Furthermore, the prior knowledge from OS-MRI countervails for the k-space undersampling inherent to PI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A magnetic resonance imaging, MRI, method for performing an image reconstruction of a sample described by its spin density distribution within a field of view, FoV, from magnetic resonance signals acquired with at least one detector, the method comprising performing the following steps, in any technically possible order:

a) applying an electromagnetic pulse sequence to the sample, wherein said electromagnetic pulse sequence comprises a plurality of radio frequency and encoding gradient pulses;

b) computing the NS-limit for the dwell time, $\delta t_{NS}=\pi/bw$, wherein bw is the expected maximum bandwidth of the expected acquired magnetic resonance signals derived from the electromagnetic sequence applied in step a);

c) defining a target oversampling rate, OR, along a readout direction as $\delta t_{NS}/\delta t$, wherein $\delta t$ is the dwell time, and wherein said target oversampling rate, OR, is higher than 1;

d) performing a prior knowledge analysis step comprising the calculation of interactions between the electromagnetic pulse sequence applied in step a) to the sample and the spins of said sample, as well as the time evolution of the spins depending on their position for said electromagnetic pulse sequence; and wherein the results of the calculation are discretized in time steps and stored as an encoding matrix, $\Phi$, oversampled along the readout direction, whose matrix elements $\Phi_{ij}$ correspond to the phase accumulated by the sample spins in the j-th pixel when only the i-th k-space data point is sampled;

e) acquiring, with the at least one detector, the magnetic resonance signals derived from each encoding gradient pulse applied in step a), and storing and discretizing said acquired magnetic resonance signals as a vector S, at a dwell time such that the sampling rate associated to said dwell time is equal to the target oversampling rate, OR, defined in step c);

f) performing an image reconstruction step based on solving for $\rho$ from S and $\Phi$, where $\rho$ is the discretized spin density distribution, wherein said discretized spin density distribution $\rho$ comprises predefined phases associated to the acquired magnetic resonance signals.

2. The method according to claim 1, wherein the electromagnetic pulse sequence is selected to yield a k-space data sampling as points in a rectangular Cartesian grid.

3. The method according to claim 1, wherein the electromagnetic pulse sequence is selected to yield a k-space data sampling along a non-Cartesian trajectory.

4. The method according to claim 3, wherein the electromagnetic pulse sequence is selected to yield a spiral scan of the k-space.

5. The method according to claim 4, whereby the spiral scan follows the curve $k(t)=(\alpha \cdot \theta(t)/FoV) \cdot e^{i\theta(t)}$ wherein $\alpha>1$, where t is the time and $\theta$ is the phase of the encoding gradient pulses.

6. The method according to claim 5, wherein $\alpha=2$.

7. The method according to claim 5, wherein $\alpha$ is a time-dependent function.

8. The method according to claim 1, wherein the electromagnetic pulse sequence is selected to provide a k-space sampling wherein the sampled data are evenly spaced, or wherein the sampled data are unevenly spaced.

9. The method according to claim 1, wherein the electromagnetic pulse sequence comprises single-shot or multi-shot sequences.

10. The method according to claim 1, wherein the image reconstruction step is performed by one of the following:
   iteratively solving a system of equations $S=\rho$;
   iteratively solving a system of equations $S=\Phi\rho$ along with regularization terms.

11. The method according to claim 1, wherein the magnetic resonance signals are acquired by a plurality of detectors, each of them characterized by a detector encoding matrix, and then combined in order to obtain the reconstructed image of the sample.

12. The method according to claim 1, wherein the target oversampling rate, OR, is higher than 3, higher than 5, higher than 10, or higher than 100.

13. An MRI apparatus comprising the following elements:
   a magnet operable to provide a magnetic field;
   a set of gradient coils configured to generate inhomogeneous magnetic fields over the field of view;
   a radio frequency transmitter configured to transmit a radio frequency field to a sample placed into the magnetic field;
   a radio frequency receiver arranged to detect a magnetic resonance signal;
   a data acquisition unit to record the magnetic resonance signals; and
   a processor capable of processing the information provided by the data acquisition unit;
   characterized in that said elements of the apparatus are configured to perform the MRI method from claim 1.

14. The apparatus according to claim 13, wherein both the radio frequency transmitter and receiver are combined in the same physical element.

15. The apparatus according to claim 13, further comprising a plurality of radio frequency receivers.

* * * * *